(12) United States Patent
Okamoto et al.

(10) Patent No.: US 8,552,471 B2
(45) Date of Patent: Oct. 8, 2013

(54) SEMICONDUCTOR APPARATUS HAVING REVERSE BLOCKING CHARACTERISTICS AND METHOD OF MANUFACTURING THE SAME

(75) Inventors: Yasuhiro Okamoto, Tokyo (JP); Yuji Ando, Tokyo (JP); Tatsuo Nakayama, Tokyo (JP); Kazuki Ota, Tokyo (JP); Takashi Inoue, Tokyo (JP); Hironobu Miyamoto, Tokyo (JP); Kazuomi Endo, Tokyo (JP)

(73) Assignee: NEC Corporation, Tokyo (JP)

( * ) Notice: Subject to any disclaimer, the term of this patent is extended or adjusted under 35 U.S.C. 154(b) by 77 days.

(21) Appl. No.: 13/139,789

(22) PCT Filed: Dec. 11, 2009

(86) PCT No.: PCT/JP2009/006776
§ 371 (c)(1),
(2), (4) Date: Jun. 15, 2011

(87) PCT Pub. No.: WO2010/082272
PCT Pub. Date: Jul. 22, 2010

(65) Prior Publication Data
US 2011/0260217 A1 Oct. 27, 2011

(30) Foreign Application Priority Data

Jan. 16, 2009 (JP) .................................. 2009-007395

(51) Int. Cl.
*H01L 29/66* (2006.01)
(52) U.S. Cl.
USPC .................. 257/194; 257/E29.246; 438/167
(58) Field of Classification Search
USPC ............... 257/194, 197, E29.246; 438/167
See application file for complete search history.

(56) References Cited

U.S. PATENT DOCUMENTS

| | | | | |
|---|---|---|---|---|
| 4,989,058 A | * | 1/1991 | Colak et al. | 257/493 |
| 5,874,753 A | * | 2/1999 | Hayafuji et al. | 257/194 |
| 6,686,616 B1 | * | 2/2004 | Allen et al. | 257/280 |
| 2006/0091498 A1 | * | 5/2006 | Sriram et al. | 257/578 |
| 2011/0049720 A1 | * | 3/2011 | Jordan | 257/763 |

FOREIGN PATENT DOCUMENTS

| | | |
|---|---|---|
| JP | 1-202870 A | 8/1989 |
| JP | 7-235551 A | 9/1995 |
| JP | 7-283417 A | 10/1995 |

(Continued)

OTHER PUBLICATIONS

International Search Report for PCT/JP2009/006776 mailed Mar. 16, 2010.

*Primary Examiner* — Bilkis Jahan

(57) ABSTRACT

There is provided a semiconductor apparatus capable of achieving both a reverse blocking characteristic and a low on-resistance. The semiconductor apparatus includes a first semiconductor layer including a channel layer, a source electrode formed on the first semiconductor layer, a drain electrode formed at a distance from the source electrode on the first semiconductor layer, and a gate electrode formed between the source electrode and the drain electrode on the first semiconductor layer. The drain electrode includes a first drain region where reverse current between the first semiconductor layer and the first drain region is blocked, and a second drain region formed at a greater distance from the gate electrode than the first drain region, where a resistance between the first semiconductor layer and the second drain region is lower than a resistance between the first semiconductor layer and the first drain region.

10 Claims, 12 Drawing Sheets

(56) References Cited

FOREIGN PATENT DOCUMENTS

| | | | |
|---|---|---|---|
| JP | 9-116144 A | 5/1997 | |
| JP | 2002343814 A | 11/2002 | |
| JP | 2003007976 A | 1/2003 | |
| JP | 2007200984 A | 8/2007 | |
| JP | 2007242746 A | 9/2007 | |
| JP | 2007250910 A | 9/2007 | |
| JP | 2007273795 A | 10/2007 | |

* cited by examiner

SEMICONDUCTOR APPARATUS HAVING REVERSE BLOCKING CHARACTERISTICS AND METHOD OF MANUFACTURING THE SAME

This application is the National Phase of PCT/JP2009/006776, filed Dec. 11, 2009, which is based upon and claims the benefit of priority from Japanese patent application No. 2009-007395, filed on Jan. 16, 2009, the disclosure of which is incorporated herein in its entirety by reference.

TECHNICAL FIELD

The present invention relates to a semiconductor apparatus and a method of manufacturing the same, and, particularly, to a semiconductor apparatus having reverse blocking characteristics and a method of manufacturing the same.

BACKGROUND ART

As a high efficiency AC/AC power conversion system, a direct conversion type power converter circuit, which is typified by a matrix converter, receives attention. In this circuit, power conversion is realized by a combination of a bidirectional switch. Generally, a semiconductor switching device fails to maintain off-characteristics when a negative drain voltage is applied. Therefore, as shown in FIG. 9, a bidirectional switch is realized by combining two sets of series connection circuits of a diode and a transistor.

The on-characteristics of such a bidirectional switch is schematically shown in FIG. 14A. Because the bidirectional switch is composed of a Schottky diode and an IGBT (Insulated Gate Bipolar Transistor), 3V, which is a sum of 1V by the diode and 2V by the IGBT, is generated as an on-voltage. As a result, a power in the hatched part of the figure is lost as a loss due to the switch.

If the switch part is composed of a FET (Field Effect Transistor), such a loss can be reduced to minimum. However, the FET generally does not have a characteristic to block reverse current, that is, reverse blocking characteristic.

FIG. 10 schematically shows drain I (current)–V (voltage) characteristics of a FET that does not have the reverse blocking characteristic. Even under the gate voltage condition that can turn off when the drain voltage is positive, when the drain voltage becomes negative, the potential of the gate shifts to the positive side in relative thereto. Therefore, a channel opens, and reverse current flows. Further, when a positive gate voltage $V_G$ is applied, reverse current increases with an increase in the gate voltage $V_G$, like $V_{G1}$, $V_{G2}$, and $V_{G3}$.

On the other hand, FIG. 11 schematically shows drain I–V characteristics of a FET that has the reverse blocking characteristic. Even when the drain voltage becomes negative, the reverse blocking characteristic can be maintained regardless of the gate voltage $V_G$ ($V_{G1} < V_G < V_{G3}$). With use of such a FET, the bidirectional switch can be configured as shown in FIG. 12. This enables cost reduction by reduction of the number of parts, and miniaturization by reduction of the mounting area. Further, by eliminating the diode, a loss during the on-state can be reduced.

As a structure having the reverse blocking characteristic as shown in FIG. 11, a FET in which a drain electrode makes a Schottky contact is proposed in Patent Literatures 1 and 2. FIG. 13 is a semiconductor apparatus that is disclosed in FIG. 1 of Patent Literature 1. On a semi-insulating substrate 105, a channel layer 101 made of an n-type SiC, layer is formed. On top of that, a source electrode 103 that makes an Ohmic contact and a drain electrode 102 that makes a Schottky contact are formed. Further, a gate electrode 104 that makes a Schottky contact is formed between the both electrodes. In addition, a metal layer 106 is formed on the backside of the semi-insulating substrate 105. In the FET disclosed in Patent Literatures 1 and 2, when a negative voltage is applied to the drain electrode, it becomes the same state as when a reverse bias is applied to the Schottky diode, and drain current is blocked, and thereby the reverse blocking characteristic is realized.

CITATION LIST

Patent Literature

Patent Literature 1: Japanese Unexamined Patent Application Publication No. 2003-007976
Patent Literature 2: Japanese Unexamined Patent Application Publication No. H01-202870

SUMMARY OF INVENTION

Technical Problem

However, when a positive voltage is applied to the drain electrode, it takes a state where an on-voltage of the Schottky diode is added to on-characteristics of the transistor, and therefore on-resistance increases. On-characteristics of the switch in this case is shown in FIG. 14B. Although the on-voltage decreases because the transistor is FET, not IGBT, an on-voltage of the drain Schottky part remains at about 1V. Therefore, when the bidirectional switch is composed of the transistor having such a structure, there is an issue that a loss in the switch part cannot be sufficiently reduced.

The present invention has been accomplished in light of the foregoing, and an object of the present invention is thus to provide a semiconductor apparatus capable of achieving both a reverse blocking characteristic and a low on-resistance.

Solution to Problem

A semiconductor apparatus according to the present invention includes a first semiconductor layer including a channel layer, a source electrode formed on the first semiconductor layer, a drain electrode formed at a distance from the source electrode on the first semiconductor layer, and a gate electrode formed between the source electrode and the drain electrode on the first semiconductor layer, in which the drain electrode includes a first drain region where reverse current between the first semiconductor layer and the first drain region is blocked, and a second drain region formed at a greater distance from the gate electrode than the first drain region, where a resistance between the first semiconductor layer and the second drain region is lower than a resistance between the first semiconductor layer and the first drain region.

A method of manufacturing a semiconductor apparatus according to the present invention includes a step of forming a first semiconductor layer including a channel layer, and a step of forming a source electrode, a drain electrode, and a gate electrode between the source electrode and the drain electrode on the first semiconductor layer, in which the drain electrode includes a first drain region where reverse current between the first semiconductor layer and the first drain region is blocked, and a second drain region formed at a greater distance from the gate electrode than the first drain region, where a resistance between the first semiconductor layer and the second drain region is lower than a resistance between the first semiconductor layer and the first drain region.

Advantageous Effects of Invention

According to the present invention, it is possible to provide a semiconductor apparatus capable of achieving both a reverse blocking characteristic and a low on-resistance.

DESCRIPTION OF EMBODIMENTS

Exemplary embodiments of the present invention will be described in detail hereinbelow. The present invention, however, is not limited to the below-described embodiments. The following description and the attached drawings are appropriately shortened and simplified to clarify the explanation.

First Exemplary Embodiment

Figure 1A:
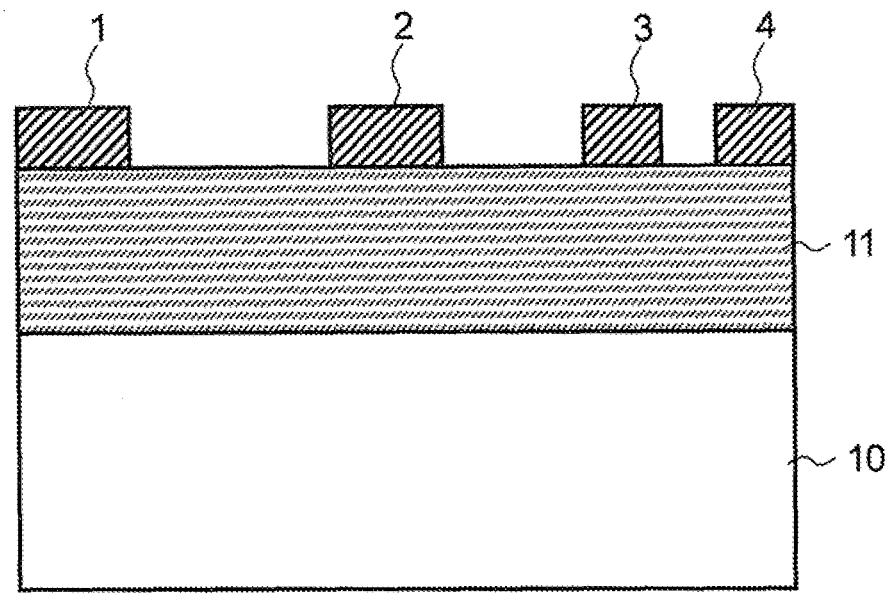
FIG. 1A is a cross-sectional view showing a structure of a field effect transistor according to a first exemplary embodiment.

FIG. 1A is a cross-sectional view of a FFT (Field Effect Transistor) according to a first exemplary embodiment of the present invention. In the FET, an n-type channel layer 11 is formed on a substrate 10 that is made of GaAs or the like, for example. Further, on the channel layer (first semiconductor layer) 11, a source electrode 1 that makes an Ohmic contact, and a first drain electrode (first drain region) 3 and a second drain electrode (second drain region) 4 that are formed at a distance from the source electrode 1 are formed. Furthermore, a gate electrode 2 that makes a Schottky contact is formed between the source electrode 1 and the first drain electrode 3.

The first drain electrode 3 and the second drain electrode 4 are at the same potential. The first drain electrode 3 that is placed on the side closer to the source electrode 1 forms a Schottky contact with the channel layer 11. On the other hand, the second drain electrode 4 that is placed on the side farther from the source electrode 1 forms an Ohmic contact with the channel layer 11. Although FIG. 1A shows the structure in which the first drain electrode 3 and the second drain electrode 4 are separated and connected at the same potential by wiring or the like, the first drain electrode 3 and the second drain electrode 4 may be in contact with each other.

In the FET according to the exemplary embodiment, when a negative voltage is applied to the drain electrodes 3 and 4, a channel becomes pinched off in the region of the first drain electrode 3, a flow of current is blocked, and thereby the reverse blocking characteristic is realized. On the other hand, when a positive voltage is applied to the drain electrodes 3 and 4, the region of the second drain electrode 4 with a low resistance becomes a current path, and a low on-resistance is obtained.

As the substrate 10, in addition to a semiconductor material such as GaAs, InP, SiC, Si, SiGe or GaN, an insulator such as sapphire may be used as long as the channel layer 11 can be formed on the upper layer.

Further, as the channel layer 11, a group III-V compound semiconductor such as InGaAs, InGaP or InAlGaN, a group IV semiconductor material such as SiC, Si or SiGe may be used. Further, it is not limited to a single semiconductor layer, and a multilayer structure with different impurity concentrations, or a structure in which a heterojunction by semiconductor layers with different band gaps is formed and an electron layer formed at its interface is used as a carrier may be employed.

Although the example in which the gate electrode 2 makes a Schottky contact is shown, an MIS (Metal-Insulator Semiconductor) structure in which a metal is placed above a semiconductor with an insulating film interposed therebetween or a structure which uses a p-n junction may be employed as long as a function of controlling current can be implemented. Further, although all of the source electrode 1, the gate electrode 2, and the drain electrodes 3 and 4 are disposed in one plane of the channel layer 11 in FIG. 1A, the gate electrode 2 may be formed in a recess which is made by removing a part of the channel layer 11, for example.

Figure 2:
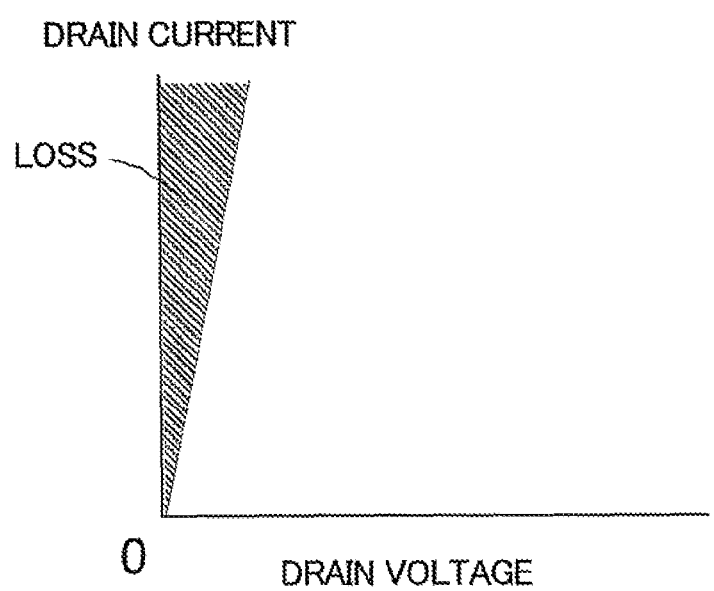
FIG. 2 is a conceptual diagram showing on-characteristics and a loss of a bidirectional switch using the field effect transistor according to the first exemplary embodiment.
Figure 9:
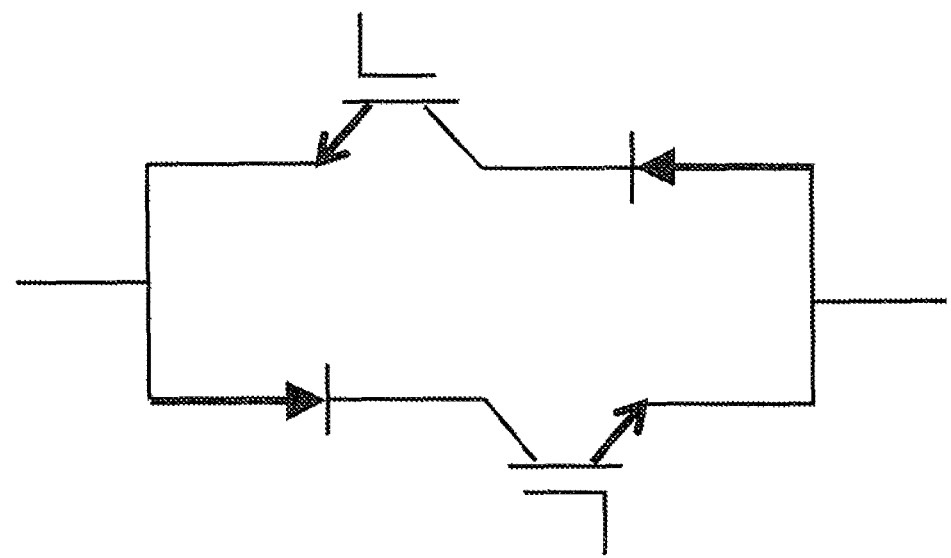
FIG. 9 is a diagram showing a circuit structure of a general bidirectional switch.
Figure 10:
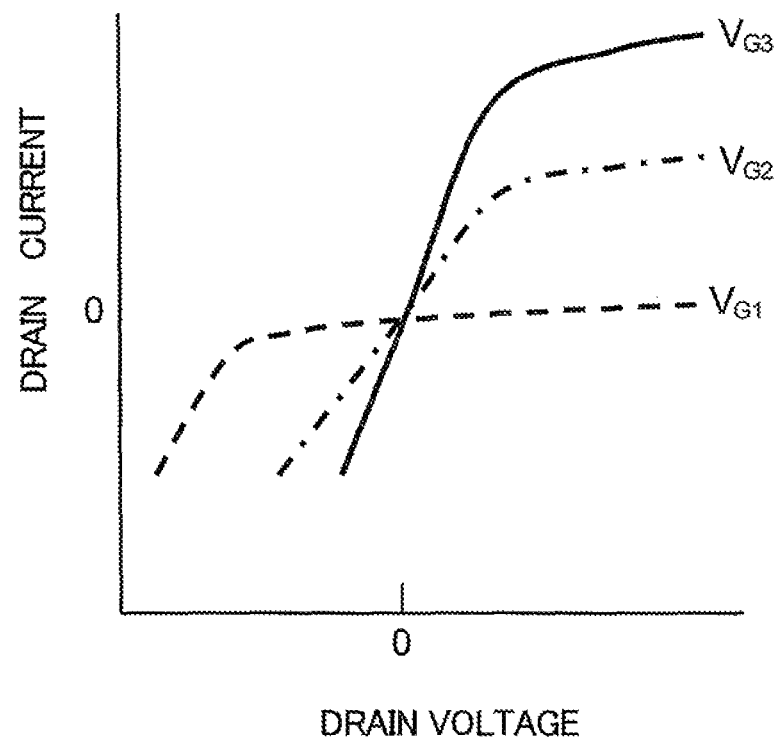
FIG. 10 is a diagram showing drain I–V characteristics of a field effect transistor not having a reverse blocking characteristic.
Figure 11:
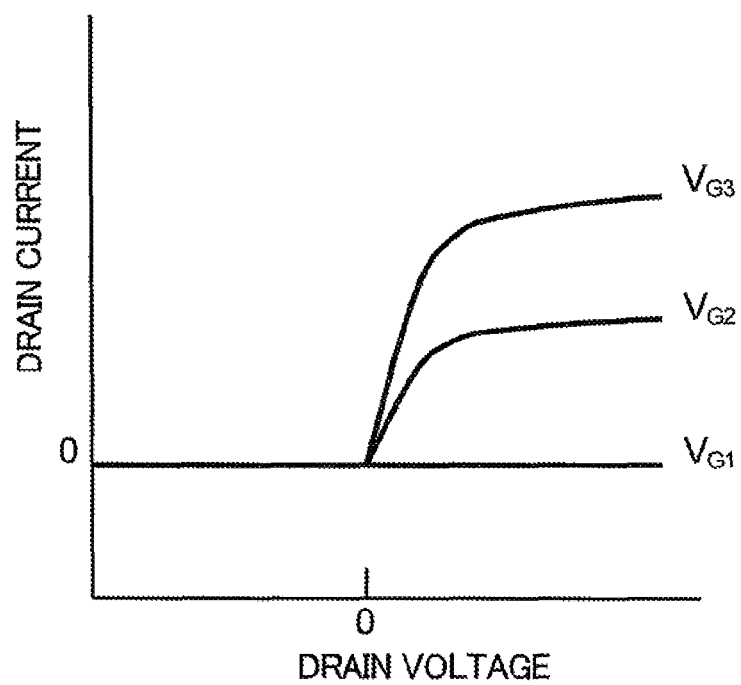
FIG. 11 is a diagram showing drain I–V characteristics of a field effect transistor having a reverse blocking characteristic.
Figure 12:
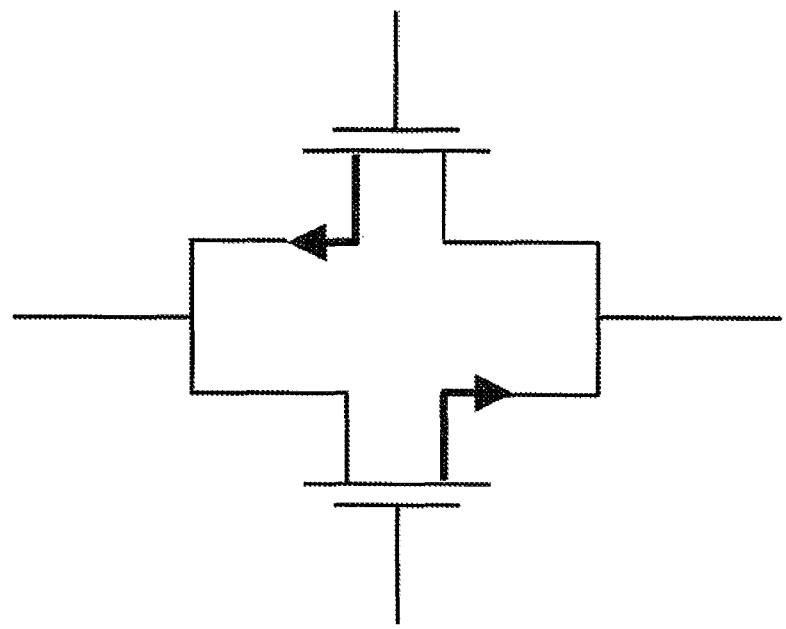
FIG. 12 is a diagram showing a circuit structure of a bidirectional switch using a transistor having a reverse blocking characteristic.
Figure 13:
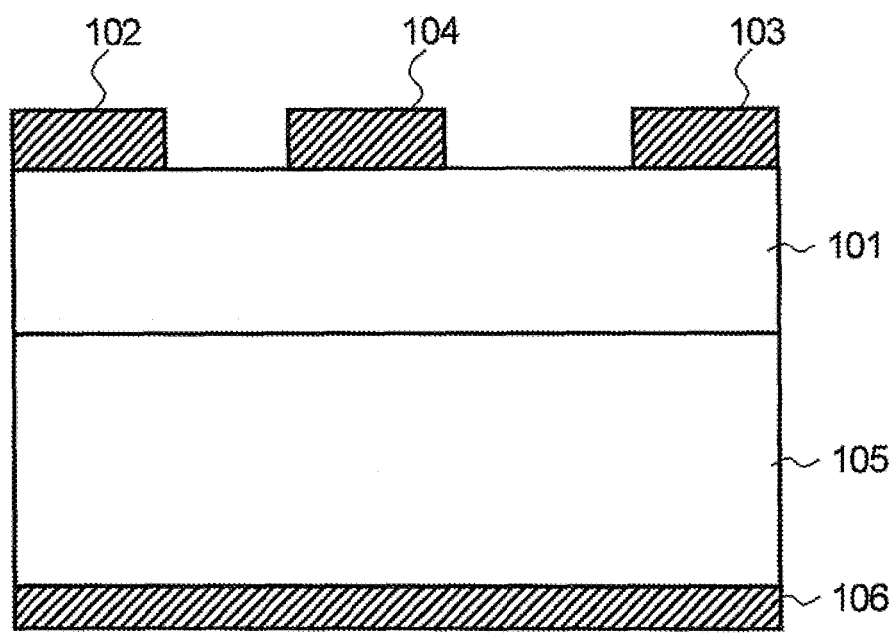
FIG. 13 is a cross-sectional view of a field effect transistor disclosed in FIG. 1 of Patent Literature 1.
Figure 14A:
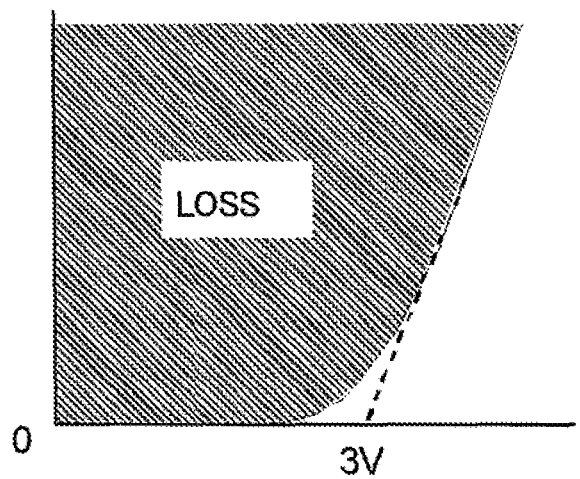
FIG. 14A is a conceptual diagram showing on-characteristics and a loss of a general bidirectional switch.
Figure 14B:
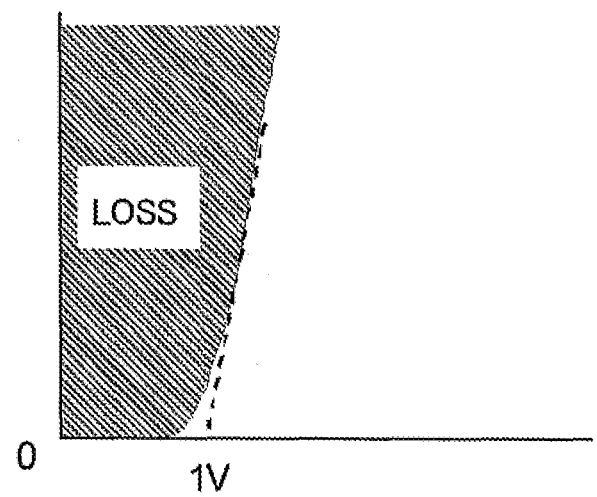
FIG. 14B is a conceptual diagram showing on-characteristics and a loss of a bidirectional switch using the field effect transistor disclosed in Patent Literature 1.

In the FET according to the exemplary embodiment, when a negative voltage is applied to the drain electrodes 3 and 4, a channel becomes pinched off in the region under the first drain electrode 3, and a flow of current is blocked. The reverse blocking characteristic as shown in FIG. 9 is thereby realized. On the other hand, when a positive voltage is applied to the drain electrodes 3 and 4, the region under the second drain electrode 4 with a low resistance becomes a current path, and a low on-resistance is obtained. FIG. 2 is a conceptual diagram schematically showing on-characteristics of a switch composed of the FET according to the exemplary embodiment. As shown in FIG. 2, the drain current rises linearly from substantially 0V, and a loss in the switch part can be suppressed to minimum. This realizes a bidirectional switch with a low loss and a low cost.

Example 1

Figure 1B:
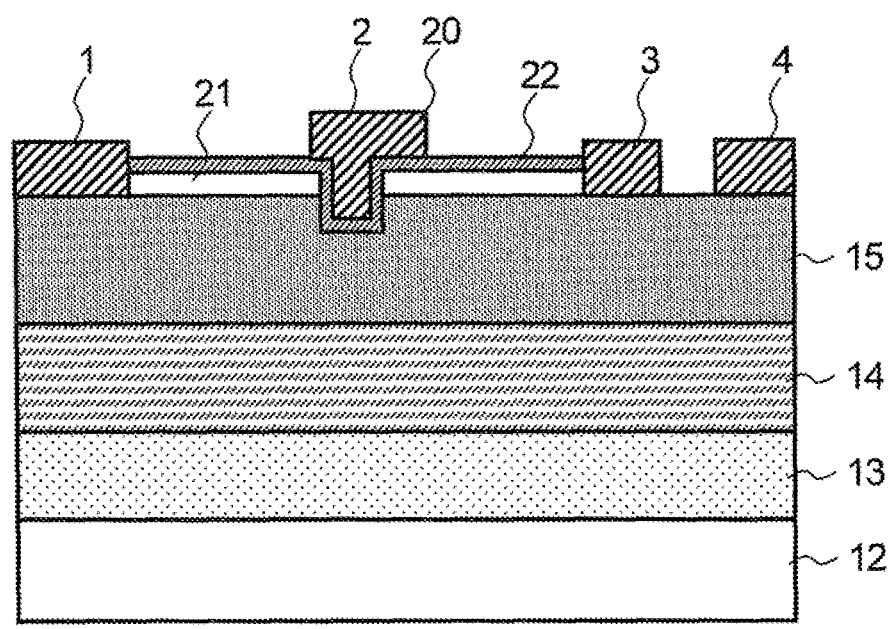
FIG. 1B is a cross-sectional view showing a structure of a field effect transistor according to an example 1.

An example 1, which is a concrete example of the first exemplary embodiment, is described next. FIG. 1B is a cross-sectional view of a FET according to the example.

The FET is formed on a substrate 12 that is made of silicon or the like. On the substrate 12, a buffer layer 13 to accommodate lattice mismatch, a channel layer 14 made of $In_xGa_{1-x}N$ ($0 \leq x \leq 1$), and an electron supply layer 15 made of $Al_yGa_{1-y}N$ ($0 < y \leq 1$) are formed sequentially. In this example, the buffer layer 13, the channel layer 14 and the electron supply layer 15 correspond to the first semiconductor layer. The range of $0 \leq x \leq 0.2$ as the composition of the channel layer 14 and $0.1 \leq y \leq 0.3$ as the composition of the electron supply layer 15 is the most suitable for a switching device for power control.

On the electron supply layer 15, the source electrode 1 and the second drain electrode 4, are formed, both making an Ohmic contact. Between the source electrode 1 and the second drain electrode 4, the first drain electrode 3 is formed, making a Schottky contact, in an area in close proximity to the second drain electrode 4. Further, the same potential is applied to the first drain electrode 3 and the second drain electrode 4.

The surface of the electron supply layer 15 is covered with a surface protective film 21. Further, in an opening (recess) that is formed between the source electrode 1 and the first drain electrode 3, a gate electrode 2 that constitutes the MIS structure with the electron supply layer 15 with a gate insulating film 22 interposed therebetween is formed. A part of the gate electrode 2 runs over the surface protective film 21 and serves as a canopy-like field plate 20 to relax the electric field concentration.

A method of manufacturing the FET according to the example 1 is described next. The case where the composition of the channel layer 14 is GaN with x=0 and the composition of the electron supply layer 15 is $Al_{0.2}Ga_{0.8}N$ with y=0.2 is shown by way of illustration. First, on the substrate 12 made of silicon, the buffer layer 13 (film thickness 20 nm) made of undoped AlN, the channel layer 14 (film thickness 2 μm) made of undoped GaN, and the electron supply layer 15 (film thickness 25 nm) made of undoped $Al_{0.2}Ga_{0.8}N$ are formed sequentially by MBE (Molecular Beam Epitaxy) growth method, for example.

Next, a part of the formed laminated structure is etched away until the channel layer 14 is exposed, thereby forming an element-separating mesa (not shown). Then, on the electron supply layer 15, a metal such as Ti/Al, for example, is deposited, thereby forming the source electrode 1 and the second drain electrode 4. Further, annealing is performed at a temperature of 650° C. to make an Ohmic contact. Then, on the electron supply layer 15, a metal such as Ni/Au, for example, is deposited, thereby forming the first drain electrode 3 making a Schottky contact.

After that, the surface protective film 21 made of SiN with a thickness of 50 nm is formed by plasma CVD or the like. A part of the surface protective film 21 is etched away, so that the electron supply layer 15 is exposed. Further, by etching, a recess is formed in such a way that a threshold value is positive. To cover the exposed electron supply layer 15, the gate insulating film 22 made of $SiO_2$ with a thickness of 150 nm is formed by normal pressure CVD or the like, for example. Further, a metal film such as Ni/Au, for example, is deposited thereon, thereby forming the gate electrode 2 with the MIS structure having the field plate 20. The FET shown in FIG. 1B is manufactured in the above manner.

The FET according to the example 1 has normally off characteristics and achieves a high dielectric strength by electric field relaxation effects brought by the field plate. It is therefore suited to a switching device for power control. Further, when a negative voltage is applied to the drain electrodes 3 and 4, because a channel immediately below the first drain electrode 3 becomes pinched off, drain current is blocked, thus exhibiting the reverse blocking characteristic. On the other hand, when a positive voltage is applied to the drain electrodes 3 and 4, drain current flows through the second drain electrode 4 with a low resistance, and on-characteristics with a low on-resistance are realized.

Second Exemplary Embodiment

Next, a second exemplary embodiment of the present invention is described with reference to FIG. 3A.

Figure 3A:
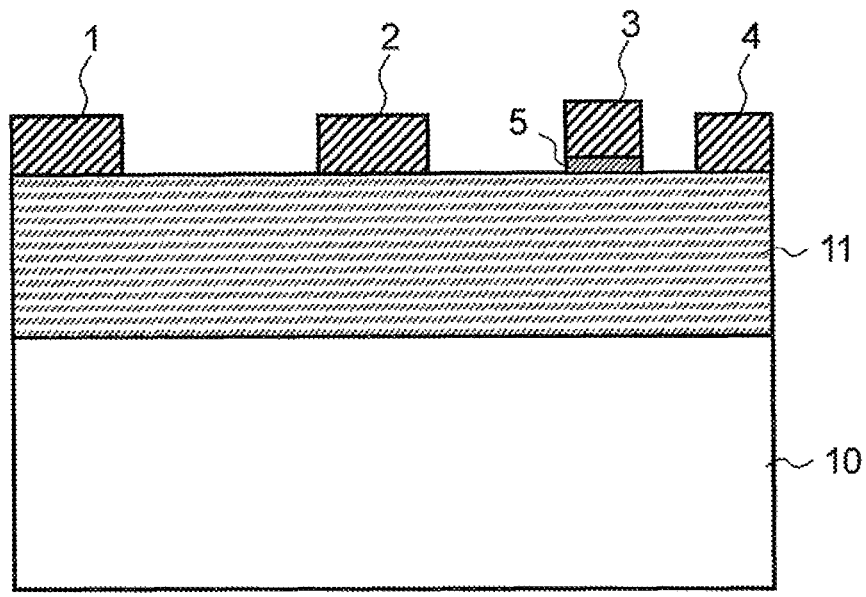
FIG. 3A is a cross-sectional view showing a structure of a field effect transistor according to a second exemplary embodiment.

FIG. 3A is a cross-sectional view of a FET according to the exemplary embodiment. This exemplary embodiment is different from the first exemplary embodiment in that the first drain electrode 3 that is placed in the position closer to the source electrode 1 constitutes the MIS structure with the channel layer 11 with an insulating film 5 interposed therebetween. The other structure is the same as that of the first exemplary embodiment, and explanation thereof is omitted.

In the FET according to this exemplary embodiment, like the first exemplary embodiment, when a negative voltage is applied to the drain electrodes 3 and 4, a channel becomes pinched off in the region under the first drain electrode 3, a flow of current is blocked, and thereby the reverse blocking characteristic is realized. On the other hand, when a positive voltage is applied to the drain electrodes 3 and 4, the region under the second drain electrode 4 with a low resistance becomes a current path, and a low on-resistance is obtained. Further, since the first drain electrode 3 has the MIS structure, leakage current during reverse blocking operation can be suppressed to be lower than that of the first exemplary embodiment.

Example 2

Figure 3B:
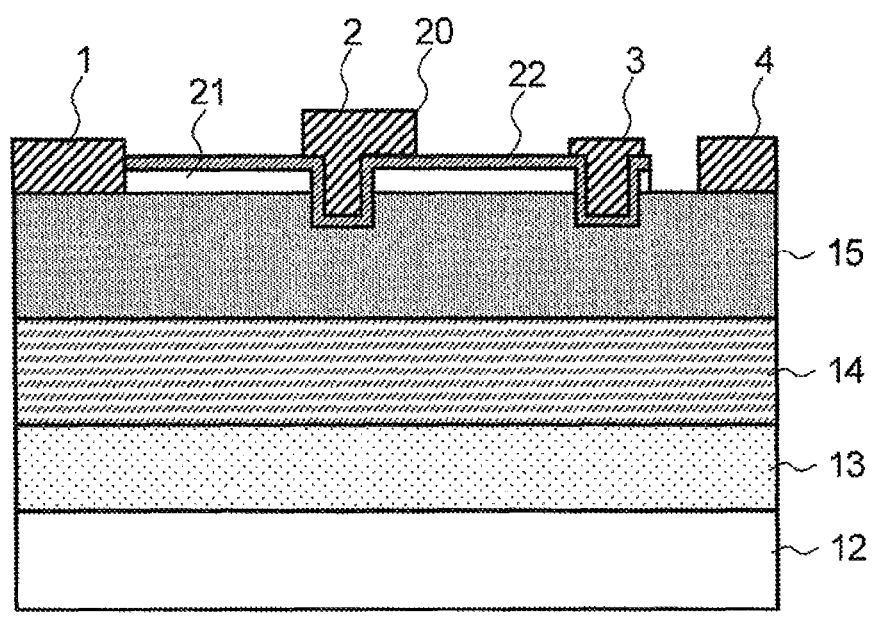
FIG. 3B is a cross-sectional view showing a structure of a field effect transistor according to an example 2.

An example 2, which is a concrete example of the second exemplary embodiment, is described next. FIG. 3B is a cross-sectional view of a FET according to the example.

The FET is formed on a substrate 12 that is made of silicon or the like. On the substrate 12, a buffer layer 13 to accommodate lattice mismatch, a channel layer 14 made of $In_xGa_{1-x}N$ ($0 \leq x \leq 1$), and an electron supply layer 15 made of $Al_yGa_{1-y}N$ ($0 < y \leq 1$) are formed sequentially. In this example, the buffer layer 13, the channel layer 14 and the electron supply layer 15 correspond to the first semiconductor layer. The range of $0 \leq x \leq 0.2$ as the composition of the channel layer 14 and $0.1 \leq y \leq 0.3$ as the composition of the electron supply layer 15 is the most suitable for a switching device for power control.

On the electron supply layer 15, the source electrode 1 and the second drain electrode 4 are formed, both making an Ohmic contact. Further, the surface of the electron supply layer 15 is covered with a surface protective film 21. Between the source electrode 1 and the second drain electrode 4, two openings are formed, and a gate electrode 2 and a first drain electrode 3 that respectively constitute the MIS structure with the electron supply layer 15 with a gate insulating film 22 interposed therebetween are formed. The first drain electrode 3 is placed adjacent to the second drain electrode 4, and the first drain electrode 3 and the second drain electrode 4 are connected at the same potential. A part of the gate electrode 2 runs over the surface protective film 21 and serves as a canopy-shaped field plate 20 to relax the electric field concentration.

A method of manufacturing the FET according to the example 2 is described next. The case where the composition of the channel layer 14 is GaN with x=0 and the composition of the electron supply layer 15 is $Al_{0.2}Ga_{0.8}N$ with y=0.2 is shown by way of illustration. First, on the substrate 12 made of silicon, the buffer layer 13 (film thickness 20 nm) made of undoped AlN, the channel layer 14 (film thickness 2 μm) made of undoped GaN, and the electron supply layer 15 (film thickness 25 nm) made of undoped $Al_{0.2}Ga_{0.8}N$ are formed sequentially by the MBE growth method, for example.

Next, a part of the formed laminated structure is etched away until the channel layer 14 is exposed, thereby forming an element-separating mesa (not shown). Then, on the electron supply layer 15, a metal such as Ti/Al, for example, is deposited, thereby forming the source electrode 1 and the second drain electrode 4. Further, annealing is performed at a temperature of 650° C. to make an Ohmic contact.

After that, the surface protective film 21 made of SiN with a thickness of 50 nm is formed by plasma CVD or the like. A part of the surface protective film 21 is etched away, thereby forming two openings in which the electron supply layer 15 is exposed. Further, a recess is formed by etching in the exposed electron supply layer 15 in such a way that a threshold value is positive immediately below the gate electrode 2. To cover the exposed electron supply layer 15, the gate insulating film 22 made of $SiO_2$ with a thickness of 150 nm is formed by normal pressure CVD or the like, for example. Further, a metal such as Ni/Au, for example, is deposited thereon, thereby forming the gate electrode 2 and the first drain electrode 3 with the MIS structure having the field plate 20. The FET shown in FIG. 3B is manufactured in the above manner.

The FET according to the example 2 has normally off characteristics and achieves a high dielectric strength by electric field relaxation effects brought by the field plate. It is therefore suited to a switching device for power control. When a negative voltage is applied to the drain electrodes 3 and 4, because a channel immediately below the first drain electrode 3 becomes pinched off, drain current is blocked, thus exhibiting the reverse blocking characteristic. On the other hand, when a positive voltage is applied to the drain electrodes 3 and 4, drain current flows through the second drain electrode 4 with a low resistance, and on-characteristics with a low on-resistance are realized. Further, since the first drain electrode 3 has the MIS structure, leakage current during reverse blocking operation can be suppressed to be lower than that of the example 1.

Third Exemplary Embodiment

Next, a third exemplary embodiment of the present invention is described with reference to FIG. 4A.

Figure 4A:
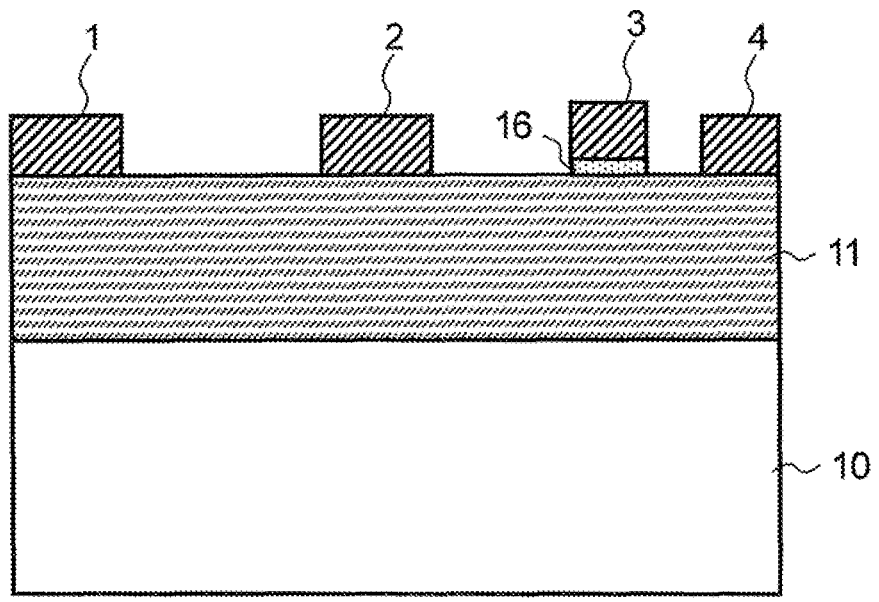
FIG. 4A is a cross-sectional view showing a structure of a field effect transistor according to a third exemplary embodiment.

FIG. 4A is a cross-sectional view of a FET according to the exemplary embodiment. This exemplary embodiment is different from the first exemplary embodiment in that the first drain electrode 3 that is placed in the position closer to the source electrode 1 is formed above the channel layer 11 with a p-type layer (second semiconductor layer) 16 having a different conductivity type from the channel layer (first semiconductor layer) 11 interposed therebetween. The other structure is the same as that of the first exemplary embodiment, and explanation thereof is omitted.

In the FET according to this exemplary embodiment, like the first exemplary embodiment, when a negative voltage is applied to the drain electrodes 3 and 4, a channel becomes pinched off in the region under the first drain electrode 3, a flow of current is blocked, and thereby the reverse blocking characteristic is realized. On the other hand, when a positive voltage is applied to the drain electrodes 3 and 4, the region under the second drain electrode 4 with a low resistance becomes a current path, and a low on-resistance is obtained.

Example 3

Figure 4B:
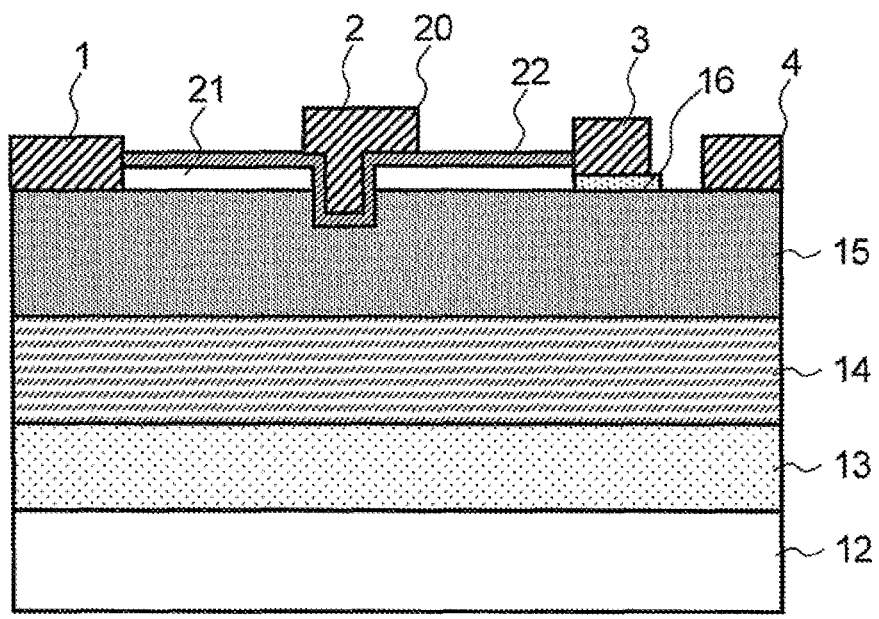
FIG. 4B is a cross-sectional view showing a structure of a field effect transistor according to an example 3.

An example 3, which is a concrete example of the third exemplary embodiment, is described next. FIG. 4B is a cross-sectional view of a FET according to the example.

The FET is formed on a substrate 12 that is made of silicon or the like. On the substrate 12, a buffer layer 13 to accommodate lattice mismatch, a channel layer 14 made of $In_xGa_{1-x}N$ ($0 \leq x \leq 1$), and an electron supply layer 15 made of $Al_yGa_{1-y}N$ ($0 < y \leq 1$) are formed sequentially. In this example, the buffer layer 13, the channel layer 14 and the electron supply layer 15 correspond to the first semiconductor layer. The range of $0 \leq x \leq 0.2$ as the composition of the channel layer 14 and $0.1 \leq y \leq 0.3$ as the composition of the electron supply layer 15 is the most suitable for a switching device for power control. As the top layer, a p-type layer 16 made of GaN is formed.

On the electron supply layer 15, the source electrode 1 and the second drain electrode 4 are formed, both making an Ohmic contact. Between the source electrode 1 and the second drain electrode 4 and above the electron supply layer 15 in close proximity to the second drain electrode 4, the first drain electrode 3 is formed with the p-type layer 16 made of GaN interposed therebetween. The first drain electrode 3 and the second drain electrode 4 are connected at the same potential.

The surface of the electron supply layer 15 is covered with a surface protective film 21. Further, in an opening that is formed between the source electrode 1 and the first drain electrode 3, a gate electrode 2 that constitutes the MIS structure with the electron supply layer 15 with a gate insulating film 22 interposed therebetween is formed. A part of the gate electrode 2 runs over the surface protective film 21 and serves as a canopy-like field plate 20 to relax the electric field concentration.

A method of manufacturing the FET according to the example 3 is described next. The case where the composition of the channel layer 14 is GaN with x=0 and the composition of the electron supply layer 15 is $Al_{0.2}Ga_{0.8}N$ with y=0.2 is shown by way of illustration. First, on the substrate 12 made of silicon, the buffer layer 13 (film thickness 20 nm) made of undoped AlN, the channel layer 14 (film thickness 2 μm) made of undoped GaN, the electron supply layer 15 (film thickness 25 nm) made of undoped $Al_{0.2}Ga_{0.8}N$, and the p-type layer 16 (film thickness 10 nm) made of GaN are formed sequentially by the MBE growth method, for example.

Next, a part of the formed laminated structure is etched away until the channel layer 14 is exposed, thereby forming an element-separating mesa (not shown). Then, the p-type layer 16 is etched away excluding the area where the first drain electrode 3 is formed, so that the electron supply layer 15 is exposed. On the exposed electron supply layer 15, a metal such as Ti/Al, for example, is deposited, thereby forming the source electrode 1 and the second drain electrode 4. Further, annealing is performed at a temperature of 650° C. to make an Ohmic contact. Then, on the electron supply layer 15, a metal such as Ni/Au, for example, is deposited, thereby forming the first drain electrode 3.

After that, the surface protective film 21 made of SiN with a thickness of 50 nm is formed by plasma CVD or the like. A part of the surface protective film 21 is etched away, so that the electron supply layer 15 is exposed. Further, by etching, a recess is formed in such a way that a threshold value is positive. To cover the exposed electron supply layer 15, the gate insulating film 22 made of $SiO_2$ with a thickness of 150 nm is formed by normal pressure CVD or the like, for example. Further, a metal film such as Ni/Au, for example, is deposited thereon, thereby forming the gate electrode 2 with the MIS structure having the field plate 20. The FET shown in FIG. 4B is manufactured in the above manner.

The FET according to the example 3 has normally off characteristics and achieves a high dielectric strength by electric field relaxation effects brought by the field plate. It is therefore suited to a switching device for power control. Further, when a negative voltage is applied to the drain electrodes 3 and 4, because a channel immediately below the first drain electrode 3 becomes pinched off, drain current is blocked, thus exhibiting the reverse blocking characteristic. On the other hand, when a positive voltage is applied to the drain electrodes 3 and 4, drain current flows through the second drain electrode 4 with a low resistance, and on-characteristics with a low on-resistance are realized.

Fourth Exemplary Embodiment

Next, a fourth exemplary embodiment of the present invention is described with reference to FIG. 5A.

Figure 5A:
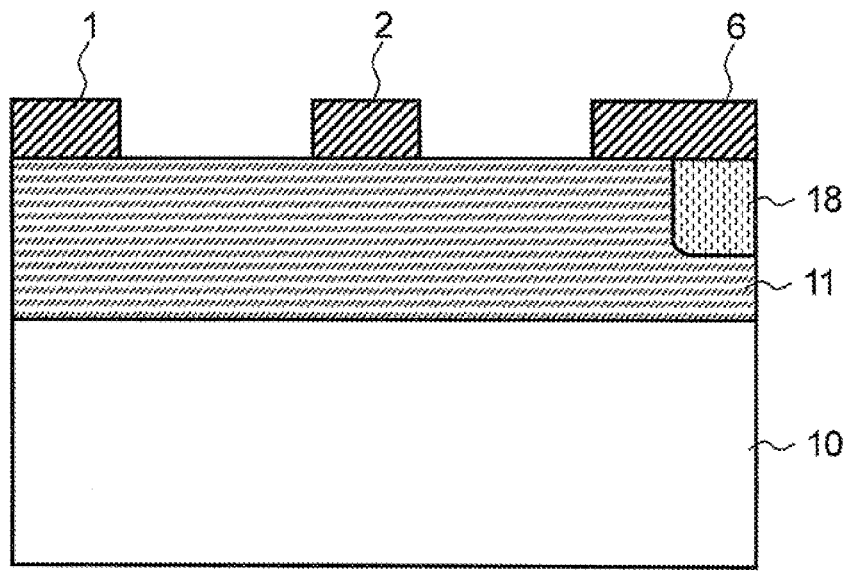
FIG. 5A is a cross-sectional view showing a structure of a field effect transistor according to a fourth exemplary embodiment.

FIG. 5A is a cross-sectional view of a FET according to the exemplary embodiment. In this exemplary embodiment, a drain electrode 6 is formed on a channel layer (first semiconductor layer) 11. A part of the drain electrode 6 on the side closer to the gate electrode 2 (first drain region) makes a Schottky contact with the channel layer 11. Further, a part of the drain electrode 6 on the side farther from the gate electrode 2 (second drain region) is formed in contact with a contact region (third semiconductor layer) 18 made of a high concentration n-type impurity diffusion layer. By setting the impurity concentration of the contact region 18 to be sufficiently high, the electron tunneling distance is shortened, and contact characteristics substantially close to the ohmic characteristics are realized. The other structure is the same as that of the first exemplary embodiment, and explanation thereof is omitted.

In the FET according to the exemplary embodiment, when a negative voltage is applied to the drain electrode 6, a channel becomes pinched off below the part of the drain electrode 6 which is not in contact with the contact region 18, and a flow of current is blocked, and thereby the reverse blocking characteristic is realized. On the other hand, when a positive voltage is applied to the drain electrode 6, drain current flows through a current path with a low resistance that is formed on the contact region 18, and a low on-resistance is obtained.

Example 4

Figure 5B:
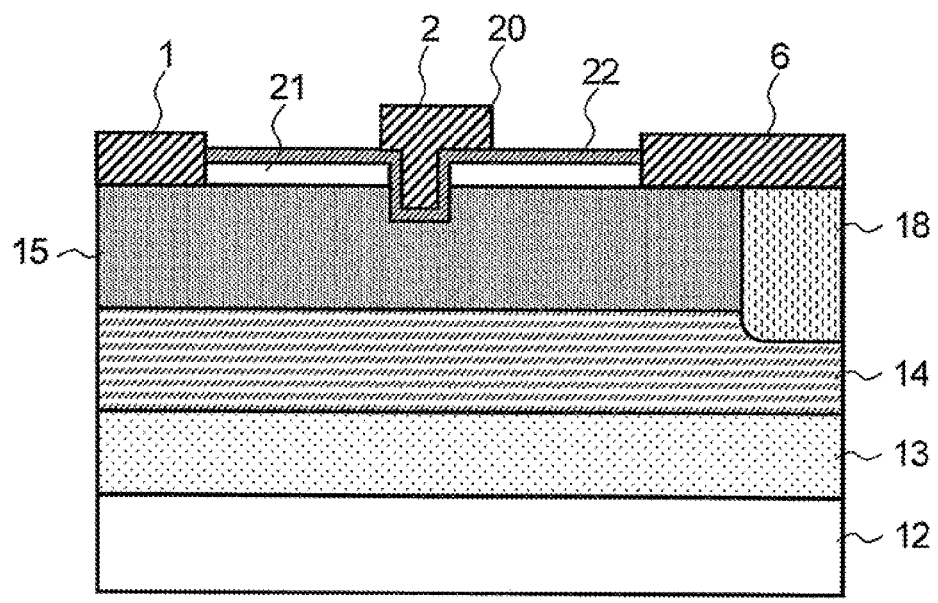
FIG. 5B is a cross-sectional view showing a structure of a field effect transistor according to an example 4.

An example 4, which is a concrete example of the fourth exemplary embodiment, is described next. FIG. 5B is a cross-sectional view of a FET according to the example.

The FET is formed on a substrate 12 that is made of silicon or the like. On the substrate 12, a buffer layer 13 to accommodate lattice mismatch, a channel layer 14 made of $In_xGa_{1-x}N$ ($0 \leq x \leq 1$), and an electron supply layer 15 made of $Al_yGa_{1-y}N$ ($0 < y \leq 1$) are formed sequentially. In this example, the buffer layer 13, the channel layer 14 and the electron supply layer 15 correspond to the first semiconductor layer. The range of $0 \leq x \leq 0.2$ as the composition of the channel layer 14 and $0.1 \leq y \leq 0.3$ as the composition of the electron supply layer 15 is the most suitable for a switching device for power control.

On the electron supply layer 15, the source electrode 1 is formed, making an Ohmic contact. In the electron supply layer 15, at a distance from the source electrode 1, the contact region 18, which is a high concentration n-type impurity diffusion layer, is formed. Further, the drain electrode 6 is formed so as to make a Schottky contact with the electron supply layer 15 on the source electrode 1 side and come into contact with the contact region 18 on the side opposite from the source electrode 1.

The surface of the electron supply layer 15 is covered with a surface protective film 21. Further, in an opening that is formed between the source electrode 1 and the drain electrode 6, a gate electrode 2 that constitutes the MIS structure with the electron supply layer 15 with a gate insulating film 22 interposed therebetween is formed. A part of the gate electrode 2 runs over the surface protective film 21 and serves as a canopy-like field plate 20 to relax the electric field concentration.

A method of manufacturing the FET according to the example 4 is described next. The case where the composition of the channel layer 14 is GaN with x=0 and the composition of the electron supply layer 15 is $Al_{0.2}Ga_{0.8}N$ with y=0.2 is shown by way of illustration. First, on the substrate 12 made of silicon, the buffer layer 13 (film thickness 20 nm) made of undoped AlN, the channel layer 14 (film thickness 2 μm) made of undoped GaN, and the electron supply layer 15 (film thickness 25 nm) made of undoped $Al_{0.2}Ga_{0.8}N$ are formed sequentially by the MBE growth method, for example.

Next, a part of the formed laminated structure is etched away until the channel layer 14 is exposed, thereby forming an element-separating mesa (not shown). Then, the contact region 18, which is a high concentration n-type impurity diffusion layer from the electron supply layer 15 down to the upper part of the channel layer 14, is formed by ion implantation or the like.

Then, on the electron supply layer 15, a metal such as Ti/Al, for example, is deposited, thereby forming the source electrode 1. Further, annealing is performed at a temperature of 650° C. to make an Ohmic contact. Then, on the electron supply layer 15, a metal such as Ni/Au, for example, is deposited, thereby forming the drain electrode 6 making a Schottky contact.

After that, the surface protective film 21 made of SiN with a thickness of 50 nm is formed by plasma CVD or the like. A part of the surface protective film 21 is etched away, so that the electron supply layer 15 is exposed. Further, by etching, a recess is formed in such a way that a threshold value is positive. To cover the exposed electron supply layer 15, the gate insulating film 22 made of $SiO_2$ with a thickness of 150 nm is formed by normal pressure CVD or the like, for example. Further, a metal film such as Ni/Au, for example, is deposited thereon, thereby forming the gate electrode 2 with the MIS structure having the field plate 20. The FET shown in FIG. 5B is manufactured in the above manner.

The FET according to the example 4 has normally off characteristics and achieves a high dielectric strength by electric field relaxation effects brought by the field plate. It is therefore suited to a switching device for power control. Further, when a negative voltage is applied to the drain electrode 6, because a channel immediately below the drain electrode 6 which is not in contact with the contact region becomes pinched off, drain current is blocked, thus exhibiting the reverse blocking characteristic. On the other hand, when a positive voltage is applied to the drain electrode 6, drain current flows through the part of the drain electrode 6 which is in contact with the contact region 18, and thereby on-characteristics with a low on-resistance are realized.

Fifth Exemplary Embodiment

Next, a fifth exemplary embodiment of the present invention is described with reference to FIG. 6A.

Figure 6A:
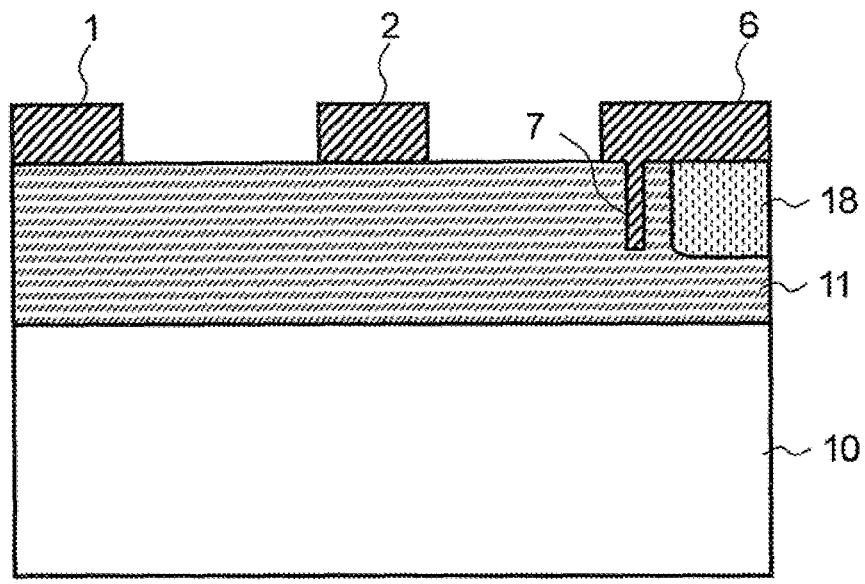
FIG. 6A is a cross-sectional view showing a structure of a field effect transistor according to a fifth exemplary embodiment.

FIG. 6A is a cross-sectional view of a FET according to the exemplary embodiment. In this exemplary embodiment, like the fourth exemplary embodiment, a drain electrode 6 is formed on a channel layer (first semiconductor layer) 11. A part of the drain electrode 6 on the side closer to the gate electrode 2 (first drain region) makes a Schottky contact with the channel layer 11. Further, a part of the drain electrode 6 on the side farther from the source electrode 1 (second drain region) is formed in contact with a contact region (second semiconductor layer) 18, which is a high concentration n-type impurity diffusion layer. Further, in this exemplary embodiment, differently from the fourth exemplary embodiment, a part of the drain electrode 6 on the side closer to the source electrode 1 is embedded in a recess that is formed in the channel layer 11. Specifically, as shown in FIG. 6A, a drain electrode embedding part 7 is formed. The other structure is the same as that of the first exemplary embodiment, and explanation thereof is omitted.

In the FET according to the exemplary embodiment, when a negative voltage is applied to the drain electrode 6, a channel becomes pinched off below the drain electrode embedding part 7, and a flow of current is blocked, and thereby the reverse blocking characteristic is realized. On the other hand, when a positive voltage is applied to the drain electrode 6, drain current flows through a current path with a low resistance that is formed in the contact region 18, and a low on-resistance is obtained. Further, with the drain electrode embedding part 7 in which a part of the drain electrode 6 is formed in a recess, the pinch-off during reverse blocking operation is improved, and leakage current can be suppressed.

Example 5

Figure 6B:
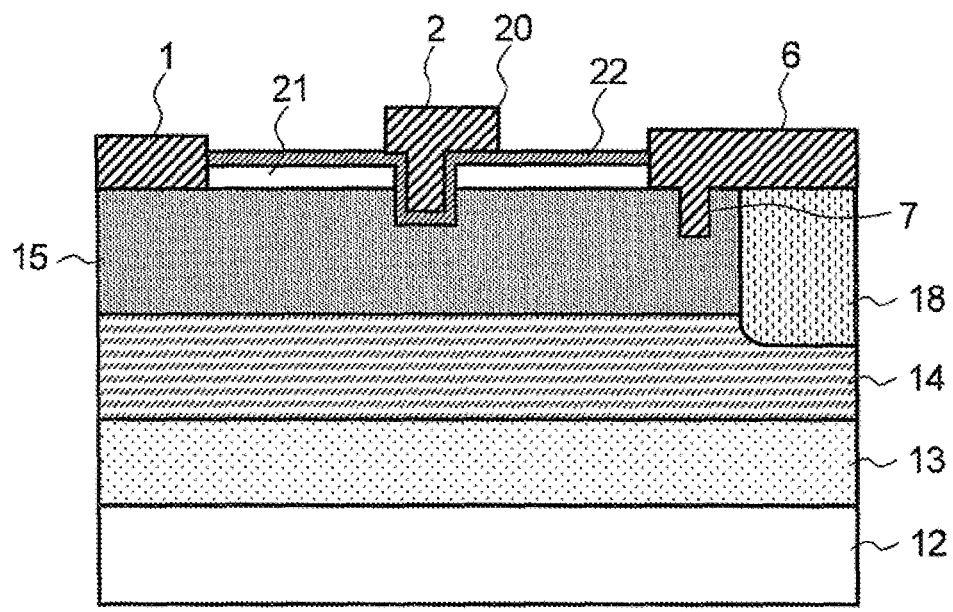
FIG. 6B is a cross-sectional view showing a structure of a field effect transistor according to an example 5.

An example 5, which is a concrete example of the fifth exemplary embodiment, is described next. FIG. 6B is a cross-sectional view of a FET according to the example.

The FET is formed on a substrate 12 that is made of silicon or the like. On the substrate 12, a buffer layer 13 to accommodate lattice mismatch, a channel layer 14 made of $In_xGa_{1-x}N$ ($0 \leq x \leq 1$), and an electron supply layer 15 made of $Al_yGa_{1-y}N$ ($0 < y \leq 1$) are formed sequentially. In this example, the buffer layer 13, the channel layer 14 and the electron supply layer 15 correspond to the first semiconductor layer. The range of $0 \leq x \leq 0.2$ as the composition of the channel layer 14 and $0.1 \leq y \leq 0.3$ as the composition of the electron supply layer 15 is the most suitable for a switching device for power control.

On the electron supply layer 15, the source electrode 1 is formed, making an Ohmic contact. In a position at a distance from the source electrode 1, the contact region 18, which is a high concentration n-type impurity diffusion layer, is formed. Further, the drain electrode 6 is formed so as to make a Schottky contact with the electron supply layer 15 on the source electrode 1 side and come into contact with the contact region 18 on the side opposite from the source electrode 1. Furthermore, a part of the drain electrode 6 on the source electrode 1 side is embedded in a recess formed in the electron supply layer 15. A drain electrode embedding part 7 is thereby formed.

The surface of the electron supply layer 15 is covered with a surface protective film 21. Further, in an opening that is formed between the source electrode 1 and the first drain electrode 3, a gate electrode 2 that constitutes the MIS structure with the electron supply layer 15 with a gate insulating film 22 interposed therebetween is formed. A part of the gate electrode 2 runs over the surface protective film 21 and serves as a canopy-like field plate 20 to relax the electric field concentration.

A method of manufacturing the FET according to the example 5 is described next. The case where the composition of the channel layer 14 is GaN with x=0 and the composition of the electron supply layer 15 is $Al_{0.2}Ga_{0.8}N$ with y=0.2 is shown by way of illustration. First, on the substrate 12 made of silicon, the buffer layer 13 (film thickness 20 nm) made of undoped AlN, the channel layer 14 (film thickness 2 μm) made of undoped GaN, and the electron supply layer 15 (film thickness 25 nm) made of undoped $Al_{0.2}Ga_{0.8}N$ are formed sequentially by the MBE growth method, for example.

Next, a part of the formed laminated structure is etched away until the channel layer 14 is exposed, thereby forming an element-separating mesa (not shown). Then, the contact region 18, which is a high concentration n-type impurity diffusion layer from the electron supply layer 15 down to the upper part of the channel layer 14, is formed by ion implantation or the like.

Then, on the electron supply layer 15, a metal such as Ti/Al, for example, is deposited, thereby forming the source electrode 1. Annealing is then performed at a temperature of 650° C. to make an Ohmic contact. Further, a recess is formed by etching away a part of the electron supply layer 15 in close proximity to the contact region 18. Then, on the electron supply layer 15, a metal such as Ni/Au, for example, is deposited, thereby forming the drain electrode 6 making a Schottky contact. The drain electrode 6 is formed to cover both of the contact region 18 and the recess. A part embedded in the recess serves as the drain electrode embedding part 7.

After that, the surface protective film 21 made of SiN with a thickness of 50 nm is formed by plasma CVD or the like. A part of the surface protective film 21 is etched away, so that the electron supply layer 15 is exposed. Further, by etching, a recess is formed in such a way that a threshold value is positive. To cover the exposed electron supply layer 15, the gate insulating film 22 made of $SiO_2$ with a thickness of 150 nm is formed by normal pressure CVD or the like, for example. Further, a metal film such as Ni/Au, for example, is deposited thereon, thereby forming the gate electrode 2 with the MIS structure having the field plate 20. The FET shown in FIG. 6B is manufactured in the above manner.

The FET according to the example 5 has normally off characteristics and achieves a high dielectric strength by electric field relaxation effects brought by the field plate. It is therefore suited to a switching device for power control.

When a negative voltage is applied to the drain electrode 6, because the channel layer 14 immediately below the drain electrode 6 which is not in contact with the contact region 18 becomes pinched off, drain current is blocked, thus exhibiting the reverse blocking characteristic. On the other hand, when a positive voltage is applied to the drain electrode 6, drain current flows through the part of the drain electrode 6 which is in contact with the contact region 18, and thereby on-characteristics with a low on-resistance are realized. Further, in the FET of this example, a part of the drain electrode 6 in the example 4 is formed in the recess. Therefore, the pinch-off during reverse blocking operation is improved, and leakage current can be suppressed.

Sixth Exemplary Embodiment

Next, a sixth exemplary embodiment of the present invention is described with reference to FIG. 7A.

Figure 7A:
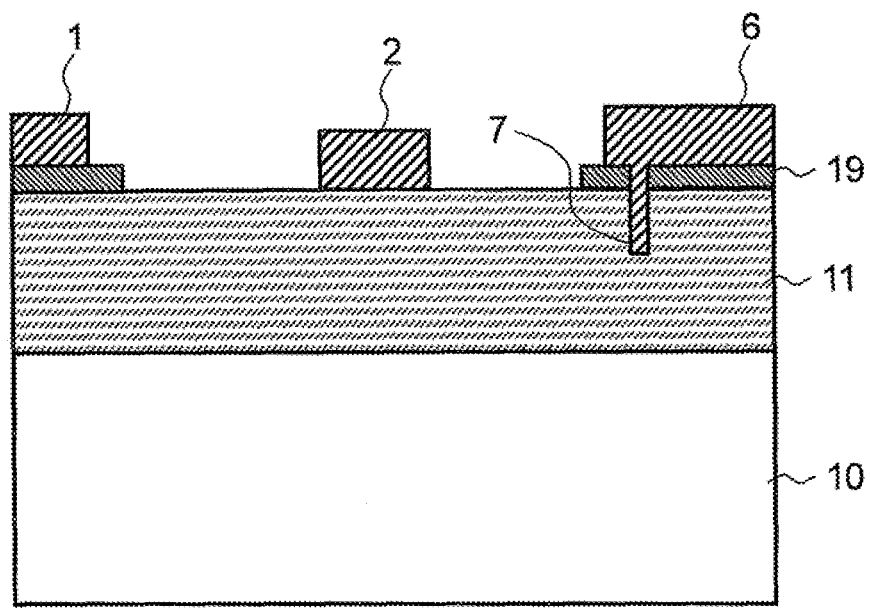
FIG. 7A is a cross-sectional view showing a structure of a field effect transistor according to a sixth exemplary embodiment.

FIG. 7A is a cross-sectional view of a FET according to the exemplary embodiment. In this exemplary embodiment, a contact layer (third semiconductor layer) 19, which is a high concentration n-type epitaxial layer, is formed on a channel layer (first semiconductor layer) 11. The contact layer has the same conductivity as the first semiconductor layer and has a higher impurity concentration than the first semiconductor layer. On the contact layer 19, a source electrode 1 that makes an Ohmic contact and a drain electrode 6 that makes a Schottky contact are formed. By setting the impurity concentration of the contact layer 19 which is in contact with a part of the drain electrode 6 on the side farther from the gate electrode 2 (second drain region) to be sufficiently high, the electron tunneling distance is shortened, and contact characteristics substantially close to the ohmic characteristics are realized. Further, in a part of the n-type contact layer 19 on which the drain electrode 6 is formed and on the side closer to the source electrode 1, a recess that penetrates the contact layer 19 and reaches the n-type channel layer is formed. A part of the drain electrode 6 is embedded inside the recess, and a drain electrode embedding part (first drain region) 7 is formed. The other structure is the same as that of the first exemplary embodiment, and explanation thereof is omitted.

In the FET according to the exemplary embodiment, when a negative voltage is applied to the drain electrode 6, a channel becomes pinched off below the drain electrode embedding part 7, and a flow of current is blocked, and thereby the reverse blocking characteristic is realized. On the other hand, when a positive voltage is applied to the drain electrode 6, drain current flows through a current path with a low resistance that is formed in the contact layer 19, and a low on-resistance is obtained. In the FET of this example, the contact layer 19, which is an epitaxial layer, is used in place of the contact region 18 in the fifth exemplary embodiment. Therefore, the similar performance to the fifth exemplary embodiment can be achieved with good controllability.

Example 6

Figure 7B:
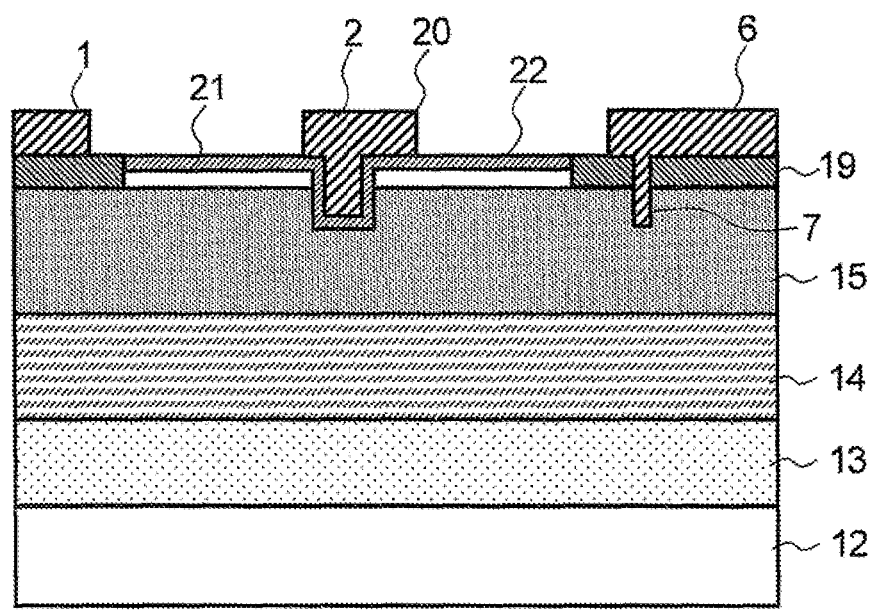
FIG. 7B is a cross-sectional view showing a structure of a field effect transistor according to an example 6.

An example 6, which is a concrete example of the sixth exemplary embodiment, is described next. FIG. 7B is a cross-sectional view of a FET according to the example.

The FET is formed on a substrate 12 that is made of silicon or the like. On the substrate 12, a buffer layer 13 to accommodate lattice mismatch, a channel layer 14 made of $In_xGa_{1-x}N$ ($0 \le x \le 1$), and an electron supply layer 15 made of $Al_yGa_{1-y}N$ ($0 < y \le 1$) are formed sequentially. In this example, the buffer layer 13, the channel layer 14 and the electron supply layer 15 correspond to the first semiconductor layer. The range of $0 \le x \le 0.2$ as the composition of the channel layer 14 and $0.1 \le y \le 0.3$ as the composition of the electron supply layer 15 is the most suitable for a switching device for power control. On the electron supply layer 15, the contact layer 19 made of n-type AlGaN having the same composition and doped into n-type is formed.

On the contact layer 19, the source electrode 1 that makes an Ohmic contact is formed. On the contact layer 19, at a distance from the source electrode 1, the drain electrode 6 is formed, making a Schottky contact. A part of the drain electrode 6 on the side closer to the source electrode 1 is embedded in the recess that penetrates the contact layer 19 and reaches the electron supply layer 15. This part forms the drain electrode embedding part 7.

The contact layer 19 is removed in the area between the source electrode 1 and the drain electrode 6. The surface of the exposed electron supply layer 15 is covered with a surface protective film 21. Further, in an opening between the source electrode 1 and the drain electrode 6, a gate electrode 2 that constitutes the MIS structure with the electron supply layer 15 with a gate insulating film 22 interposed therebetween is formed. A part of the gate electrode 2 runs over the surface protective film 21 and serves as a canopy-like field plate 20 to relax the electric field concentration.

A method of manufacturing the FET according to the example 6 is described next. The case where the composition of the channel layer 14 is GaN with x=0 and the composition of the electron supply layer 15 is $Al_{0.2}Ga_{0.8}N$ with y=0.2 is shown by way of illustration. First, on the substrate 12 made of silicon, the buffer layer 13 (film thickness 20 nm) made of undoped AlN, the channel layer 14 (film thickness 2 μm) made of undoped GaN, the electron supply layer 15 (film thickness 25 nm) made of undoped $Al_{0.2}Ga_{0.8}N$, and the contact layer 19 (film thickness 25 nm, impurity concentration $1 \times 10^{19}$ cm$^{-3}$) made of n-type AlGaN are formed sequentially by the MBE growth method, for example.

Next, a part of the formed laminated structure is etched away until the channel layer 14 is exposed, thereby forming an element-separating mesa (not shown). Then, on the contact layer 19, a metal such as Ti/Al, for example, is deposited, thereby forming the source electrode 1. Further, annealing is performed at a temperature of 650° C. to make an Ohmic contact. Furthermore, a recess that penetrates the contact layer 19 and reaches the electron supply layer 15 is formed by etching in the position to form the drain electrode embedding part 7. Then, a metal such as Ni/Au is deposited in contact with the electron supply layer 15, thereby forming the drain electrode 6 making a Schottky contact. A part embedded in the recess serves as the drain electrode embedding part 7.

After that, the contact layer 19 between the source electrode 1 and the drain electrode 6 is etched way, so that the electron supply layer 15 is exposed. Then, the surface protective film 21 made of SiN with a thickness of 50 nm is formed by plasma CVD or the like. A part of the surface protective film 21 is etched away, so that the electron supply layer 15 is exposed. Further, by etching, a recess is formed in such a way that a threshold value is positive. To cover the exposed electron supply layer 15, the gate insulating film 22 made of $SiO_2$ with a thickness of 150 nm is formed by normal pressure CVD or the like, for example. Further, a metal such as Ni/Au, for example, is deposited thereon, thereby forming the gate electrode 2 with the MIS structure having the field plate 20. The FET shown in FIG. 7B is manufactured in the above manner.

The FET according to the example 6 has normally off characteristics and achieves a high dielectric strength by electric field relaxation effects brought by the field plate. It is therefore suited to a switching device for power control. When a negative voltage is applied to the drain electrode 6, because the channel layer 14 immediately below the drain electrode 6 which is not in contact with the contact layer 19 becomes pinched off, drain current is blocked, thus exhibiting the reverse blocking characteristic. On the other hand, when a positive voltage is applied to the drain electrode 6, drain current flows through the part of the drain electrode 6 which is in contact with the contact layer 19, and thereby on-characteristics with a low on-resistance are realized. In the FET of this example, the contact layer 19, which is an epitaxial layer, is formed in placed of the contact region 18 in the example 5. Therefore, the similar performance to the example 5 can be achieved with good controllability.

Seventh Exemplary Embodiment

Next, a seventh exemplary embodiment of the present invention is described with reference to FIG. 8A.

Figure 8A:
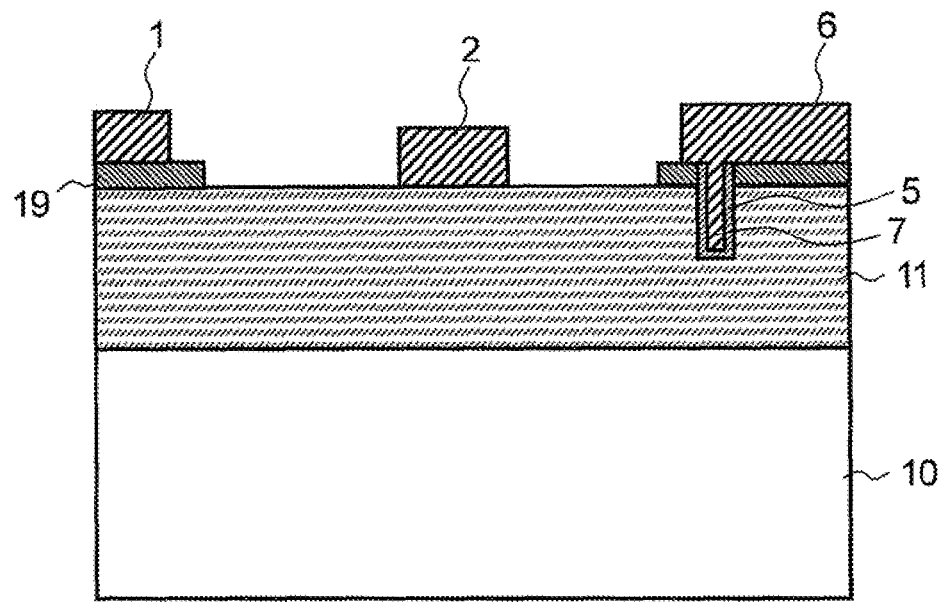
FIG. 8A is a cross-sectional view showing a structure of a field effect transistor according to a seventh exemplary embodiment.

FIG. 8A is a cross-sectional view of a FET according to the exemplary embodiment. In this exemplary embodiment, a contact layer (third semiconductor layer) 19, which is a high concentration n-type epitaxial layer, is formed on a channel layer (first semiconductor layer) 11. On the contact layer 19, a source electrode 1 that makes an Ohmic contact and a drain electrode 6 that makes a Schottky contact are formed. By setting the impurity concentration of the contact layer 19 in contact with a part of the drain electrode 6 on the side farther from the gate electrode 2 (second drain region) to be sufficiently high, the electron tunneling distance is shortened, and contact characteristics substantially close to the ohmic characteristics are realized. Further, in a part of the n-type contact layer 19 on which the drain electrode 6 is formed and on the side closer to the source electrode 1, a recess that penetrates the contact layer 19 and reaches the channel layer 11 is formed. A part of the drain electrode 6 is embedded inside the recess with an insulating film 5 interposed therebetween, and thereby a drain electrode embedding part (first drain region) 7 is formed. Specifically, the drain electrode embedding part 7 constitutes the MIS structure with the channel layer 11. The other structure is the same as that of the first exemplary embodiment, and explanation thereof is omitted.

In the FET according to the exemplary embodiment, when a negative voltage is applied to the drain electrode 6, a channel becomes pinched off below the drain electrode embedding part 7, and a flow of current is blocked, and thereby the reverse blocking characteristic is realized. On the other hand, when a positive voltage is applied to the drain electrode 6, drain current flows through a current path with a low resistance that is formed in the contact layer 19, and a low on-resistance is obtained. In the FET of the example, the drain electrode embedding part 7 in the sixth exemplary embodiment has the MIS structure, and therefore leakage current during reverse blocking operation can be reduced to be lower than that of the sixth exemplary embodiment.

Example 7

Figure 8B:
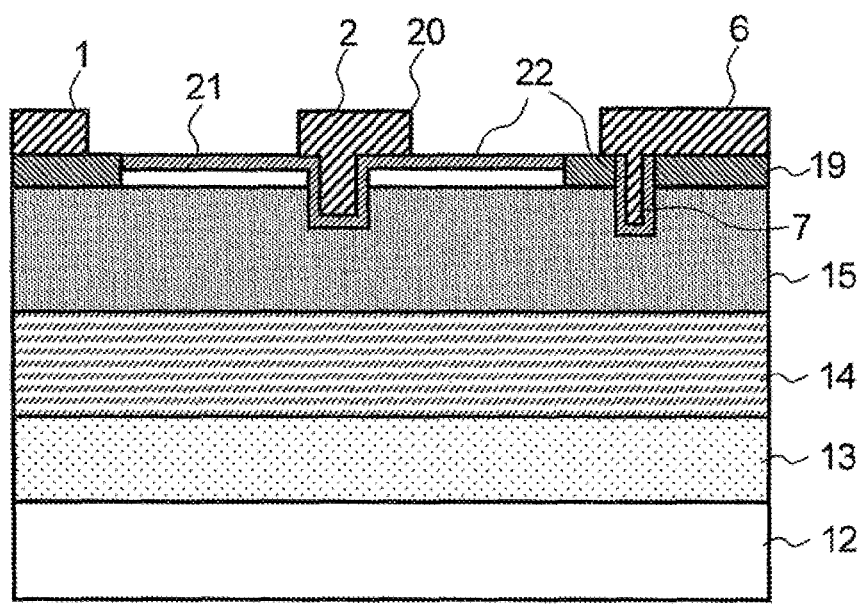
FIG. 8B is a cross-sectional view showing a structure of a field effect transistor according to an example 7.

An example 7, which is a concrete example of the seventh exemplary embodiment, is described next. FIG. 8B is a cross-sectional view of a FET according to the example.

The FET is formed on a substrate 12 that is made of silicon or the like. On the substrate 12, a buffer layer 13 to accommodate lattice mismatch, a channel layer 14 made of $In_xGa_{1-x}N$ ($0 \leq x \leq 1$), and an electron supply layer 15 made of $Al_yGa_{1-y}N$ ($0 < y \leq 1$) are formed sequentially. In this example, the buffer layer 13, the channel layer 14 and the electron supply layer 15 correspond to the first semiconductor layer. The range of $0 \leq x \leq 0.2$ as the composition of the channel layer 14 and $0.1 \leq y \leq 0.3$ as the composition of the electron supply layer 15 is the most suitable for a switching device for power control. On the electron supply layer 15, the contact layer 19 made of n-type AlGaN having the same composition and doped into n-type is placed.

On the contact layer 19, the source electrode 1 that makes an Ohmic contact is formed. On the contact layer 19, at a distance from the source electrode 1, the drain electrode 6 that makes a Schottky contact is formed. A part of the drain electrode 6 on the side closer to the source electrode 1 is embedded in the recess that penetrates the contact layer 19 and reaches the electron supply layer 15. This part forms the drain electrode embedding part 7. Further, a gate insulating film 22 is formed between the drain electrode embedding part 7 and the electron supply layer 15. Thus, the drain electrode embedding part 7 constitutes the MIS structure with the electron supply layer 15.

The contact layer 19 is removed in the area between the source electrode 1 and the drain electrode 6. The surface of the exposed electron supply layer 15 is covered with a surface protective film 21. Further, in an opening between the source electrode 1 and the drain electrode 6, a gate electrode 2 that constitutes the MIS structure with the electron supply layer 15 with a gate insulating film 22 interposed therebetween is formed. A part of the gate electrode 2 runs over the surface protective film 21 and serves as a canopy-like field plate 20 to relax the electric field concentration.

A method of manufacturing the FET according to the example 7 is described next. The case where the composition of the channel layer 14 is GaN with x=0 and the composition of the electron supply layer 15 is $Al_{0.2}Ga_{0.8}N$ with y=0.2 is shown by way of illustration. First, on the substrate 12 made of silicon, the buffer layer 13 (film thickness 20 nm) made of undoped AlN, the channel layer 14 (film thickness 2 μm) made of undoped GaN, the electron supply layer 15 (film thickness 25 nm) made of undoped $Al_{0.2}Ga_{0.8}N$, and the contact layer 19 (film thickness 25 nm, impurity concentration $1 \times 10^{19}$ cm$^{-3}$) made of n-type AlGaN are formed sequentially by the MBE growth method, for example.

Next, a part of the formed laminated structure is etched away until the channel layer 14 is exposed, thereby forming an element-separating mesa (not shown). Then, on the contact layer 19, a metal such as Ti/Al, for example, is deposited, thereby forming the source electrode 1. Further, annealing is performed at a temperature of 650° C. to make an Ohmic contact. Then, a recess that penetrates the contact layer 19 and reaches the electron supply layer 15 is formed by etching in the position to form the drain electrode embedding part 7.

Further, the contact layer 19 in the vicinity of an area to form the gate electrode is etched away, so that the electron supply layer 15 is exposed. Then, the surface protective film 21 made of SiN with a thickness of 50 nm is formed by plasma CVD or the like. A part of the surface protective film 21 is etched away, so that the AlGaN electron supply layer 15 is exposed. Further, by etching, a recess is formed in such a way that a threshold value is positive. Here, the surface protective film 21 on top of the contact layer 19 on which the drain electrode 6 is to be formed is also removed. To cover the exposed electron supply layer 15 and the contact layer 19, the gate insulating film 22 made of $SiO_2$ with a thickness of 150 nm is formed by normal pressure CVD or the like, for example. After removing the gate insulating film 22 on the top surface of the contact layer 19, a metal such as Ni/Au, for example, is deposited thereon, thereby forming the gate electrode 2 and the drain electrode 6 with the MIS structure having the field plate 20. The FET shown in FIG. 8B is manufactured in the above manner.

The FET according to the example 7 has normally off characteristics and achieves a high dielectric strength by electric field relaxation effects brought by the field plate. It is therefore suited to a switching device for power control. When a negative voltage is applied to the drain electrode 6, because a channel immediately below the drain electrode 6 which is not in contact with the contact layer 19, that is, the drain electrode embedding part 7, becomes pinched off, drain current is blocked, thus exhibiting the reverse blocking characteristic. On the other hand, when a positive voltage is applied to the drain electrode 6, drain current flows through the part of the drain electrode 6 which is in contact with the contact layer 19 and thereby on-characteristics with a low on-resistance are realized. In the FET of the example, the drain electrode embedding part 7 in the example 6 has the MIS structure, and therefore leakage current during reverse blocking operation can be reduced to be lower than that of the example 6.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

INDUSTRIAL APPLICABILITY

The present invention is applicable to a direct conversion type power converter circuit, for example.

REFERENCE SIGNS LIST

1 SOURCE ELECTRODE
2 GATE ELECTRODE
3 FIRST DRAIN ELECTRODE
4 SECOND DRAIN ELECTRODE
5 INSULATING FILM
6 DRAIN ELECTRODE
7 DRAIN ELECTRODE EMBEDDING PART
10 SUBSTRATE
11 CHANNEL LAYER
12 SUBSTRATE
13 BUFFER LAYER
14 CHANNEL LAYER
15 ELECTRON SUPPLY LAYER
16 P-TYPE LAYER
18 CONTACT REGION
19 CONTACT LAYER
20 FIELD PLATE
21 SURFACE PROTECTIVE FILM
22 GATE INSULATING FILM

The invention claimed is:
1. A semiconductor apparatus comprising:
a first semiconductor layer including a channel layer;
a source electrode formed on the first semiconductor layer;
a drain electrode formed at a distance from the source electrode on the first semiconductor layer; and
a gate electrode formed between the source electrode and the drain electrode on the first semiconductor layer,
wherein the drain electrode includes
a first drain region where reverse current between the first semiconductor layer and the first drain region is blocked, and
a second drain region formed at a greater distance from the gate electrode than the first drain region, where a resistance between the first semiconductor layer and the second drain region is lower than a resistance between the first semiconductor layer and the first drain region, and
wherein a second semiconductor layer having a different conductivity type from the first semiconductor layer is formed between the first drain region and the first semiconductor layer and; wherein the first drain region and the second drain region are separated.

2. The semiconductor apparatus according to claim 1, wherein the source electrode makes an Ohmic contact with the first semiconductor layer.

3. The semiconductor apparatus according to claim 1, wherein the gate electrode makes a Schottky contact with the first semiconductor layer.

4. The semiconductor apparatus according to claim 1, wherein an insulating film is formed between the gate electrode and the first semiconductor layer, constituting an MIS structure.

5. The semiconductor apparatus according to claim 1, wherein the first semiconductor layer contains a heterojunction by semiconductor layers with different band gaps.

6. A semiconductor apparatus comprising:
a first semiconductor layer including a channel layer;
a source electrode formed on the first semiconductor layer;
a drain electrode formed at a distance from the source electrode on the first semiconductor layer; and
a gate electrode formed between the source electrode and the drain electrode on the first semiconductor layer,
wherein the drain electrode includes
a first drain region where reverse current between the first semiconductor layer and the first drain region is blocked, and
a second drain region formed at a greater distance from the gate electrode than the first drain region, where a resistance between the first semiconductor layer and the second drain region is lower than a resistance between the first semiconductor layer and the first drain region, and
wherein a third semiconductor layer having the same conductivity type as the first semiconductor layer and having a higher impurity concentration than the first semiconductor layer is formed between the second drain region and the first semiconductor layer and; wherein a recess is formed in the first semiconductor layer, and the first drain region is formed in the recess.

7. The semiconductor apparatus according to claim 6, wherein the first drain region makes a Schottky contact with the first semiconductor layer.

8. The semiconductor apparatus according to claim 6, wherein the first drain region and the second drain region are integral.

9. The semiconductor apparatus according to claim 6, wherein the third semiconductor layer is an epitaxial layer formed on top of the first semiconductor layer.

10. A method of manufacturing a semiconductor apparatus comprising:
a step of forming a first semiconductor layer including a channel layer; and
a step of forming a source electrode, a drain electrode, and a gate electrode between the source electrode and the drain electrode, on the first semiconductor layer,
wherein the drain electrode includes
a first drain region where reverse current between the first semiconductor layer and the first drain region is blocked, and
a second drain region formed at a greater distance from the gate electrode than the first drain region, where a resistance between the first semiconductor layer and the second drain region is lower than a resistance between the first semiconductor layer and the first drain region, and wherein a second semiconductor layer having a different conductivity type from the first semiconductor layer is formed between the first drain region and the first semiconductor layer and; wherein the first drain region and the second drain region are separated.

* * * * *